US012613168B2

(12) United States Patent
Wu et al.

(10) Patent No.: US 12,613,168 B2
(45) Date of Patent: Apr. 28, 2026

(54) METHOD OF IDENTIFYING DEFECTS IN CRYSTALS

(71) Applicant: GlobalWafers Co., Ltd., Hsinchu (TW)

(72) Inventors: YewChung Sermon Wu, Hsinchu (TW); Bing-Yue Tsui, Hsinchu (TW); Tsan-Feng Lu, Hsinchu (TW); Cheng-Jui Yang, Hsinchu (TW); Chen Yuan Lee, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 175 days.

(21) Appl. No.: 18/776,277

(22) Filed: Jul. 18, 2024

(65) Prior Publication Data

US 2025/0093240 A1 Mar. 20, 2025

(30) Foreign Application Priority Data

Sep. 20, 2023 (TW) .................................. 112135870

(51) Int. Cl.
*G01N 1/32* (2006.01)
*G01N 21/88* (2006.01)
*H10P 14/69* (2026.01)

(52) U.S. Cl.
CPC ........... *G01N 1/32* (2013.01); *H10P 14/6905* (2026.01); *G01N 2021/8874* (2013.01)

(58) Field of Classification Search
CPC .............. G01N 1/32; G01N 2021/8874; H10P 14/6905
USPC ....................................................... 356/237.1
See application file for complete search history.

(56) References Cited

U.S. PATENT DOCUMENTS

2018/0151514 A1* 5/2018 Bu .......................... H10D 18/65
2022/0025543 A1* 1/2022 Lin ....................... C30B 23/025

FOREIGN PATENT DOCUMENTS

CN 102569055 5/2014
CN 111238910 6/2020
TW 202300903 1/2023

OTHER PUBLICATIONS

Yong-Zhao Yao et al., "Molten KOH Etching with Na2O2 Additive for Dislocation Revelation in 4H—SiC Epilayers and Substrates", Japanese Journal of Applied Physics, Jul. 20, 2011, pp. 1-8, vol. 50.

* cited by examiner

*Primary Examiner* — Md M Rahman
(74) *Attorney, Agent, or Firm* — JCIPRNET

(57) ABSTRACT

A method of identifying defects in crystals includes the following steps. A silicon carbide crystal to be identified for defects is sliced to obtain a test piece. An etching process is performed on the test piece. Etching conditions of the etching process includes the following. An etchant including potassium hydroxide is used, and etching is performed at a temperature of 400° C. to 550° C. in an environment where dry air or oxygen is introduced, so as to form etching pits of threading edge dislocations (TED) and threading screw dislocations (TSD) in the test piece. After the etching process is performed, a diameter ratio (TED/TSD) of the etching pits of the threading edge dislocations (TED) and the threading screw dislocations (TSD) observed by an optical microscope in the test piece is in a range of 0.2 to 0.5.

11 Claims, 2 Drawing Sheets

METHOD OF IDENTIFYING DEFECTS IN CRYSTALS

CROSS-REFERENCE TO RELATED APPLICATION

This application claims the priority benefit of Taiwan application serial no. 112135870, filed on Sep. 20, 2023. The entirety of the above-mentioned patent application is hereby incorporated by reference herein and made a part of this specification.

BACKGROUND

Technical Field

The disclosure relates to a method of identifying defects in crystals, and more particularly, to method of identifying defects in silicon carbide crystals.

Description of Related Art

Silicon carbide (SiC) is a wide-band-gap semiconductor material. Silicon carbide has many remarkable physical properties, making it a high-power, high-temperature, and high-frequency electronic main element nowadays.

Crystal growth of silicon carbide is not easy, and defects will seriously affect the performance of silicon carbide elements. As far as the existing technology is concerned, potassium hydroxide (KOH) is currently used to etch out etching pits of some major defects in silicon carbide (SiC), including threading screw dislocations (TSD), threading edge dislocations (TED), and basal plane dislocations (BPD). Morphologies of the etching pits of the defects are different. However, it is sometimes difficult to distinguish between the morphology (hexagonal) of the threading screw dislocation (TSD) and the morphology (circle) of the threading edge dislocation (TED). For example, depending on differences in etching conditions, sometimes included angles between edges of the hexagonal morphology of the etching pits formed by the threading screw dislocations (TSD) are not obvious, which are easily confused with the circular etching pits, resulting in errors in identification of different defects.

Accordingly, there is an urgent need for a method of identifying defects in silicon carbide crystals to improve an identification rate of various defects.

SUMMARY

The disclosure provides a method of identifying defects in crystals, which may improve an identification rate of threading screw dislocations (TSD), threading edge dislocations (TED), and basal plane dislocations (BPD).

A method of identifying defects in crystals in the disclosure includes the following steps. A silicon carbide crystal to be identified for defects is sliced to obtain a test piece. An etching process is performed on the test piece. Etching conditions of the etching process includes the following. An etchant including potassium hydroxide (KOH) is used, and etching is performed at a temperature of 400° C. to 550° C. in an environment where dry air or oxygen is introduced, so as to form etching pits of threading edge dislocations (TED) and threading screw dislocations (TSD) in the test piece. After the etching process is performed, a diameter ratio (TED/TSD) of the etching pits of the threading edge dislocations (TED) and the threading screw dislocations (TSD) observed by an optical microscope in the test piece is in a range of 0.2 to 0.5.

In an embodiment of the disclosure, after the etching process is performed, the diameter ratio (TED/TSD) of the etching pits of the threading edge dislocations (TED) and the threading screw dislocations (TSD) observed by the optical microscope in the test piece is in a range of 0.2 to 0.5.

In an embodiment of the disclosure, the etchant including potassium hydroxide is selected from 100% of potassium hydroxide, 10% of sodium peroxide ($Na_2O_2$) and 90% of potassium hydroxide, or 50% of sodium hydroxide (NaOH) and 50% of potassium hydroxide.

In an embodiment of the disclosure, the etching is performed at a temperature of 450° C. to 500° C. in the environment where the dry air is introduced.

In an embodiment of the disclosure, the etching is performed at a temperature of 400° C. to 460° C. in the environment where the oxygen is introduced.

In an embodiment of the disclosure, the etching is performed at a temperature of 450° C. to 460° C. in the environment where the oxygen is introduced.

In an embodiment of the disclosure, after the etching process, the etching pits of the threading screw dislocations (TSD) observed by the optical microscope in the test piece have a hexagonal morphology, and an included angle between edges of the hexagon is in a range of 115° to 125°.

In an embodiment of the disclosure, after the etching process, the etching pits of the threading edge dislocations (TED) observed by the optical microscope in the test piece have a circular morphology.

In an embodiment of the disclosure, after the etching process, a diameter of the etching pits of the threading screw dislocations (TSD) observed by the optical microscope in the test piece is in a range of 50 μm and 200 μm.

In an embodiment of the disclosure, after the etching process, a diameter of the etching pits of the threading edge dislocations (TED) observed by the optical microscope in the test piece is in a range of 20 μm and 75 μm.

In an embodiment of the disclosure, the etching process further includes the following. The etching is performed at a heating rate of 10° C./min and an etching time of 5 to 10 minutes. An oxygen flow rate of the dry air or the oxygen is 20 sccm.

In an embodiment of the disclosure, after the etching process is performed, a relative ratio (BPD/TSD) of diameters of etching pits of basal plane dislocations (BPD) and the threading screw dislocations (TSD) observed by the optical microscope in the test piece is in a range of 0.17 to 0.36.

Based on the above, through the method of identifying the defects in the crystals according to the embodiment of the disclosure, through the difference in etching rates between different surfaces, the difference in the morphologies of the three etching defects in the silicon carbide crystals may become more obvious. Therefore, the identification rate of the threading screw dislocations (TSD), the threading edge dislocations (TED), and the basal plane dislocations (BPD) may be improved.

DETAILED DESCRIPTION OF DISCLOSED EMBODIMENTS

Figure 1:
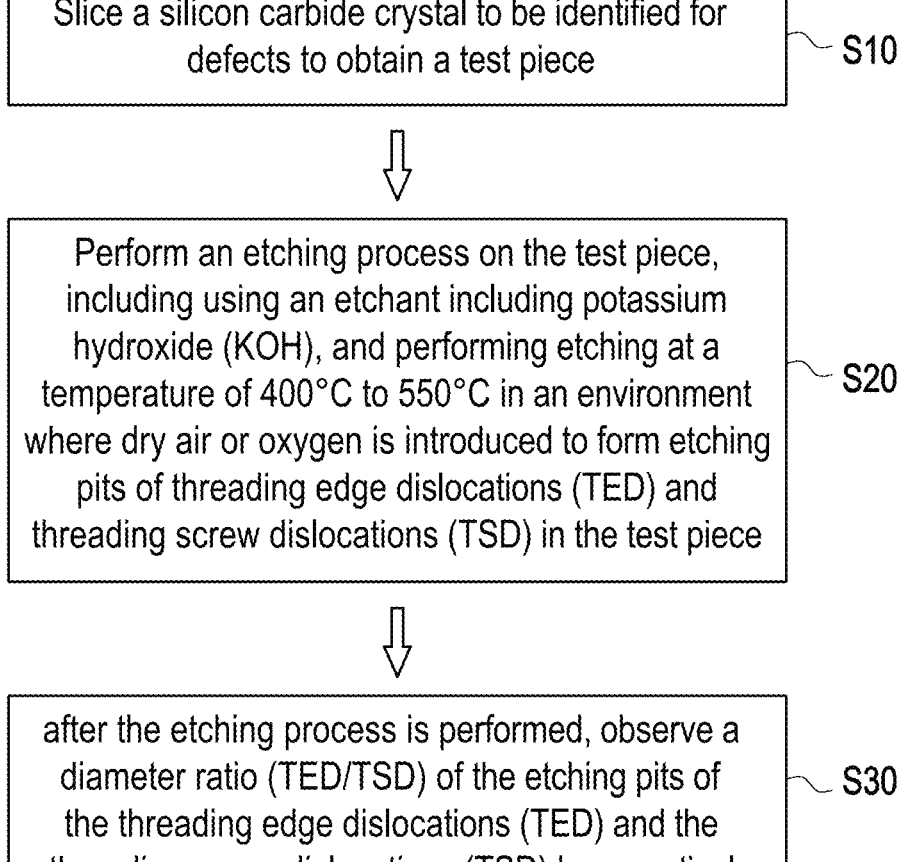
FIG. 1 is a flowchart of a method of identifying defects in crystals according to an embodiment of the disclosure.
Figure 2:
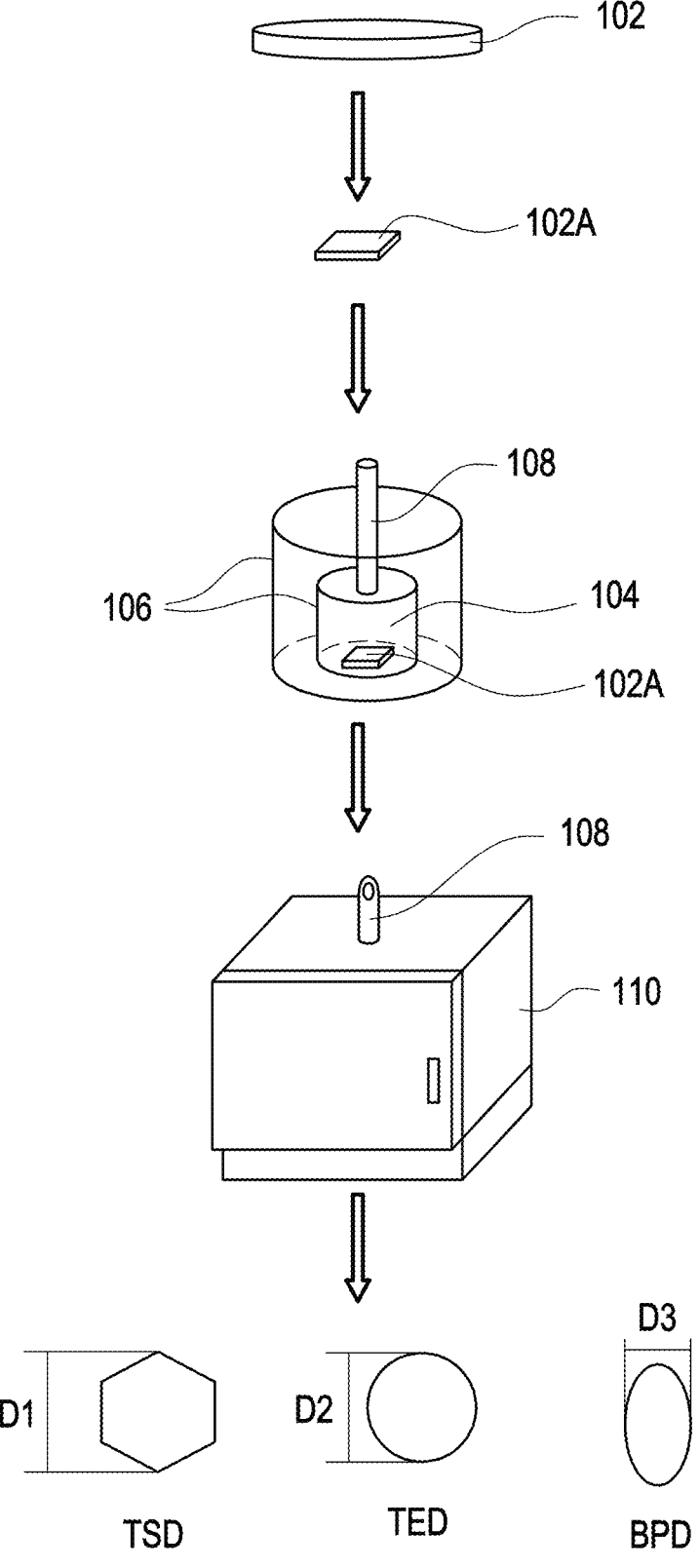
FIG. 2 is a schematic flowchart of a method of identifying defects in crystals according to an embodiment of the disclosure.

FIG. 1 is a flowchart of a method of identifying defects in crystals according to an embodiment of the disclosure. FIG. 2 is a schematic flowchart of a method of identifying defects in crystals according to an embodiment of the disclosure. Hereinafter, the method of identifying the defects in the crystals according to the embodiment of the disclosure will be described with reference to FIGS. 1 and 2.

Referring to step S10 in FIG. 1 and FIG. 2, in the method of identifying the defects in the crystals according to the embodiment of the disclosure, a silicon carbide crystal 102 to be identified for defects is sliced to obtain a test piece 102A.

Next, referring to step S20 in FIG. 1 and FIG. 2, an etching process is performed on the test piece 102A. In some embodiments, the etching process includes the following. The test piece 102A is placed into a nickel crucible 106, and an etchant 104 is added. In some embodiments, an etchant including potassium hydroxide (KOH) is used for the etchant 104. For example, the etchant 104 is selected from one of 100% of potassium hydroxide, 10% of sodium peroxide ($Na_2O_2$) and 90% of potassium hydroxide, and 50% of sodium hydroxide (NaOH) and 50% of potassium hydroxide. After the etchant 104 is added to the nickel crucible 106, a vent tube 108 is used to introduce dry air or oxygen.

In some embodiments, etching is performed at a temperature of 400° C. to 550° C. in an environment where dry air or oxygen is introduced, and for example, steps of heating and etching are performed in a heating furnace 110. In some embodiments, the etching is performed at a temperature of 450° C. to 500° C. in the environment where the dry air is introduced. In some embodiments, the etching is performed at a temperature of 400° C. to 460° C. in the environment where the oxygen is introduced. In a specific embodiment, when oxygen is introduced, the etching is performed at a temperature of 450° C. to 460° C. In addition, the above etching process further includes the following. The etching is performed at a heating rate of 10° C./min and an etching time of 5 to 10 minutes, and an oxygen flow rate when the dry air or oxygen is introduced is 20 sccm. In some embodiments, the above etching process is performed to form etching pits of threading edge dislocations (TED), threading screw dislocations (TSD), and basal plane dislocations (BPD) in the test piece 102A.

In embodiments of the disclosure, if the etching process is performed under the above etching conditions in the environment where the dry air or oxygen is introduced, it may further cause differences in morphologies of the etching pits of the threading edge dislocations (TED) and the threading screw dislocations (TSD), increasing an identification rate of the two. If the dry air or oxygen is not introduced when the etching process is performed, for example, when the etching is performed in an atmospheric environment, the identification rate between the threading screw dislocations (TSD) and the threading edge dislocations (TED) is not high.

Next, referring to step S30 in FIG. 1 and FIG. 2, after the etching process is performed, the through-edge dislocations (TED), a diameter of the etching pits of the threading edge dislocations (TED), the threading screw dislocations (TSD), and the basal plane dislocations (BPD) in the test piece 102A is observed by an optical microscope. For example, after the etching process, the etching pits of the threading screw dislocations (TSD) observed by the optical microscope in the test piece 102A have a hexagonal morphology and have a diameter D1, and an included angle between edges of the hexagon is in a range of 115° to 125°. After the etching process, the etching pits of the threading edge dislocations (TED) observed by the optical microscope in the test piece 102A have a circular morphology and have a diameter D2. In addition, after the etching process, the etching pits of the basal plane dislocations (BPD) observed by the optical microscope in the test piece 102A have an elliptical morphology and have a diameter D3 (a short-side diameter).

Through the method in the embodiment of the disclosure, a diameter ratio (TED/TSD; D2/D1) of the etching pits of the threading edge dislocations (TED) and the threading screw dislocations (TSD) observed by the optical microscope in the test piece 102A is in a range of 0.2 to 0.5. In some embodiments, the diameter ratio (TED/TSD; D2/D1) of the etching pits of the threading edge dislocations (TED) and the threading screw dislocations (TSD) observed by the optical microscope in the test piece 102A is in a range of 0.2 to 0.35. In addition, a relative ratio (BPD/TSD; D3/D1) of the diameters of the etching pits of the basal plane dislocations (BPD) and the threading screw dislocations (TSD) observed by the optical microscope in the test piece 102A is in a range of 0.17 to 0.36. In some embodiments, the diameter of the etching pits of the threading screw dislocations (TSD) observed by the optical microscope is in a range of 50 μm to 200 μm. In some embodiments, the diameter the etch pits of the threading edge dislocations (TED) observed by the optical microscope is in a range of 20 μm to 75 μm.

Accordingly, through the method in the embodiment of the disclosure, when a diameter size and ratio of the etching pits of the threading edge dislocations (TED), the threading screw dislocations (TSD), and the basal plane dislocations (BPD) are in the above range, the differences in the morphologies of the three etching defects in the silicon carbide crystals are more obvious. Therefore, the identification rate of the threading screw dislocations (TSD), the threading edge dislocations (TED), and the basal plane dislocations (BPD) may be improved.

Example

In order to prove that the method of identifying the defects in the crystals in the disclosure may effectively increase the identification rate of the three etching defects in the silicon carbide crystals, the following examples are particularly used for description.

In this example, as shown in the above steps in FIGS. 1 and 2, in the environment where 20 sccm of the dry air (experimental groups A1 to A3) or oxygen (experimental group B1 to B3) was introduced, or in the atmospheric environment (control groups C1 to C3), the etching process was performed under the etching conditions recorded in Table 1. Results of (i) the diameter of the threading screw dislocations (TSD), (ii) the diameter ratio (TED/TSD) of the etching pits of the threading edge dislocations (TED) and the threading screw dislocations (TSD), and (iii) the diameter ratio (BPD/TSD) of etching pits of the basal plane dislocations (BPD) and the threading screw dislocations (TSD) were shown in Table 1.

TABLE 1

| Group | Etching time (min) | Oxygen flow rate (sccm) | Changes in oxygen flow rate | Etchant | Oxygen Content (%) | Atmosphere Environment | TSD Diameter | TED/TSD diameter | BPD/TSD diameter |
|---|---|---|---|---|---|---|---|---|---|
| Control group C1 | 10 | 0 | None | KOH 100% | ~21% | Atmosphere of 600° C. | 20 | 0.86 | 0.43 |
| Experimental group A1 | 10 | 20 sccm | Continuous | KOH 100% | 20% | Dry air of 500° C. | 90 | 0.48 | 0.36 |
| Experimental group B1 | 10 | 20 sccm | Continuous | KOH 100% | 100% | Oxygen of 450° C. | 75 | 0.31 | 0.25 |
| Control group C2 | 20 | 0 | None | Na₂O₂/KOH (10%/90%) | ~21% | Atmosphere of 600° C. | 128 | 0.88 | 0.21 |
| Experimental group A2 | 10 | 20 sccm | Continuous | Na₂O₂/KOH (10%/90%) | 20% | Dry air of 450° C. | 70 | 0.31 | 0.23 |
| Experimental group B2 | 5 | 20 sccm | Continuous | Na₂O₂/KOH (10%/90%) | 100% | Oxygen of 460° C. | 128 | 0.25 | 0.17 |
| Control group C3 | 10 | 0 | None | NaOH/KOH (50%/50%) | ~21% | Atmosphere of 550° C. | 40 | 0.6 | 0.6 |
| Experimental group A3 | 10 | 20 sccm | Continuous | NaOH/KOH (50%/50%) | 20% | Dry air of 450° C. | 61 | 0.35 | 0.26 |
| Experimental group B3 | 10 | 20 sccm | Continuous | NaOH/KOH (50%/50%) | 100% | Oxygen of 460° C. | 75 | 0.29 | 0.21 |

In the experimental examples of the disclosure, when the etching was performed in the atmospheric environment, if an etching temperature was lower than 550° C. the differ- ences in the etching pits of the threading edge dislocations (TED) and the threading screw dislocations (TSD) may not be effectively identified, and the included angle between the edges of the hexagon of the etching pits of the threading screw dislocations (TSD) was not in the range of 115° to 125°. Accordingly, in the experimental examples of the disclosure, when the etching was performed in the atmo- spheric environment, the etching process was performed at a temperature of 550° C. to 600° C. as a control group.

As shown in Table 1, when the etching was performed in the atmospheric environment (the control groups C1 to C3), the diameter ratio (TED/TSD) of the etching pits of the threading edge dislocations (TED) and the threading screw dislocations (TSD) was in a range of 0.6 to 0.88, and the diameter ratio (BPD/TSD) of the etching pits of the basal plane dislocations (BPD) and the threading screw disloca- tions (TSD) was in a range of 0.21 to 0.6. That is to say, the differences in the morphologies of the threading screw dislocations (TSD) and the basal plane dislocations (BPD) may be identified through the conventional etching method performed in the atmospheric environment. However, since the diameter ratio (TED/TSD) of the etching pits of the threading edge dislocations (TED) and the threading screw dislocations (TSD) is close to 1 (that is, the diameters of the two are equal), it is sometimes easy to cause misjudgment of the etching defects in the morphologies.

In comparison, if the etching was performed in the environment with the dry air and at a lower etching tem- perature (450° C. to 500° C.), the diameter ratio (TED/TSD) of the etching pits of the threading edge dislocations (TED) and the threading screw dislocations (TSD) may be reduced to a range of 0.31 to 0.48, and the diameter ratio (BPD/TSD) of the etching pits of the basal plane dislocations (BPD) and the threading screw dislocations (TSD) may be controlled in a range of 0.23 to 0.36. In other words, the above etching conditions may make the differences in the morphologies of the threading edge dislocations (TED), the threading screw dislocations (TSD), and the basal plane dislocations (BPD) more obvious, increasing the identification rate of the three etching defects in the silicon carbide crystals. In addition, according to the experimental results, in the environment with the dry air, when the etching was performed with an etchant with 10% of sodium peroxide (Na₂O₂) and 90% of potassium hydroxide (the experimental group A2) or an etchant with 50% of sodium hydroxide (NaOH) and 50% of potassium hydroxide (the experimental group A3), com- pared to using 100% of potassium hydroxide, the difference in the diameter ratio (TED/TSD) of the etching pits may be further reduced, so that the identification rate of the three etching defects in the silicon carbide crystals is higher.

In addition, if the etching was performed in the environ- ment where the oxygen was introduced and at a lower etching temperature (450° C. to 460° C.), the diameter ratio (TED/TSD) of the etching pits of the threading edge dislo- cations (TED) and the threading screw dislocations (TSD) may be reduced to a range of 0.25 to 0.31, and the diameter ratio (BPD/TSD) of the etching pits of the basal plane dislocations (BPD) and the threading screw dislocations (TSD) may be controlled in a range of 0.17 to 0.25. In other words, the above etching conditions may make the differ- ences in the morphologies of the threading edge dislocations (TED), the threading screw dislocations (TSD), and the basal plane dislocations (BPD) more obvious, increasing the identification rate of the three etching defects in the silicon carbide crystals. In addition, according to the experimental results, in the environment where the oxygen was intro- duced, when the etching was performed with the etchant with 10% of sodium peroxide (Na₂O₂) and 90% of potas- sium hydroxide (the experimental group B2) or the etchant with 50% of sodium hydroxide (NaOH) and 50% of potas- sium hydroxide (the experimental group B3), compared to using 100% of potassium hydroxide, the difference in the diameter ratio (TED/TSD) of the etching pits may be further reduced, so that the identification rate of the three etching defects in the silicon carbide crystals is higher. In addition, when the etching was performed in the environment where the oxygen was introduced, compared to the etching per- formed in the environment with the dry air, the difference in the diameter ratio (TED/TSD) of the etching pits may also be further reduced, so that the identification rate of the three etching defects in the silicon carbide crystals is higher.

Based on the above, in the method of identifying the defects in the crystals according to the embodiment of the disclosure, through the difference in etching rates between different surfaces, the difference in the morphologies of the three etching defects in the silicon carbide crystals may become more obvious. Therefore, the identification rate of the threading screw dislocations (TSD), the threading edge dislocations (TED), and the basal plane dislocations (BPD) may be improved.

What is claimed is:

1. A method of identifying defects in crystals, comprising:
slicing a silicon carbide crystal to be identified for defects to obtain a test piece;
performing an etching process on the test piece, wherein etching conditions of the etching process comprise:
using an etchant comprising potassium hydroxide (KOH), and performing etching at a temperature of 400° C. to 550° C. in an environment where dry air or oxygen is introduced to form etching pits of threading edge dislocations (TED) and threading screw dislocations (TSD) in the test piece,
wherein after the etching process is performed, a diameter ratio (TED/TSD) of the etching pits of the threading edge dislocations (TED) and the threading screw dislocations (TSD) observed by an optical microscope in the test piece is in a range of 0.2 to 0.5.

2. The method according to claim 1, wherein the etchant comprising potassium hydroxide is selected from 100% of potassium hydroxide, 10% of sodium peroxide ($Na_2O_2$) and 90% of potassium hydroxide, or 50% of sodium hydroxide (NaOH) and 50% of potassium hydroxide.

3. The method according to claim 1, wherein the etching is performed at a temperature of 450° C. to 500° C. in the environment where the dry air is introduced.

4. The method according to claim 1, wherein the etching is performed at a temperature of 400° C. to 460° C. in the environment where the oxygen is introduced.

5. The method according to claim 4, wherein the etching is performed at a temperature of 450° C. to 460° C. in the environment where the oxygen is introduced.

6. The method according to claim 1, wherein after the etching process, the etching pits of the threading screw dislocations (TSD) observed by the optical microscope in the test piece have a hexagonal morphology, and an included angle between edges of the hexagon is in a range of 115° to 125°.

7. The method according to claim 1, wherein after the etching process, the etching pits of the threading edge dislocations (TED) observed by the optical microscope in the test piece have a circular morphology.

8. The method according to claim 1, wherein after the etching process, a diameter of the etching pits of the threading screw dislocations (TSD) observed by the optical microscope in the test piece is in a range of 50 μm and 200 μm.

9. The method according to claim 1, wherein after the etching process, a diameter of the etching pits of the threading edge dislocations (TED) observed by the optical microscope in the test piece is in a range of 20 μm and 75 μm.

10. The method according to claim 1, wherein the etching process further comprises performing the etching at a heating rate of 10° C./min and an etching time of 5 to 10 minutes, and an oxygen flow rate of the dry air or the oxygen is 20 sccm.

11. The method according to claim 1, wherein after the etching process is performed, a relative ratio (BPD/TSD) of diameters of etching pits of basal plane dislocations (BPD) and the threading screw dislocations (TSD) observed by the optical microscope in the test piece is in a range of 0.17 to 0.36.

* * * * *